United States Patent [19]
Patel

[11] Patent Number: 5,999,411
[45] Date of Patent: Dec. 7, 1999

[54] APPARATUS FOR PROTECTING CONNECTORS ON CIRCUIT PACKS

[75] Inventor: Naresh C. Patel, Howell, N.J.

[73] Assignee: Lucent Technologies Inc., Murray Hill, N.J.

[21] Appl. No.: 09/127,244

[22] Filed: Jul. 31, 1998

[51] Int. Cl.$^6$ ...................................... H05K 5/00
[52] U.S. Cl. .......................... 361/759; 361/785; 361/788; 361/798; 361/801; 361/803; 361/824; 174/65 R; 174/66; 200/50.02; 200/50.03; 439/135; 439/136; 439/137; 439/138; 439/924.1; 439/924.2
[58] Field of Search ...................................... 361/748–804, 361/679; 439/911, 157, 160; 200/50.1, 50.03, 50.02; 174/65 R, 67

[56] References Cited

U.S. PATENT DOCUMENTS

| | | | |
|---|---|---|---|
| 3,781,495 | 12/1973 | Splingaerd | 200/50.1 |
| 3,932,716 | 1/1976 | Mottel et al. | 200/50 A |
| 4,071,722 | 1/1978 | Hart | 200/50 A |
| 4,454,552 | 6/1984 | Barnes et al. | 361/788 |
| 4,614,389 | 9/1986 | Albert et al. | 339/45 M |
| 4,812,009 | 3/1989 | Carlisle et al. | 350/96.21 |
| 4,911,646 | 3/1990 | Marson et al. | 439/911 |
| 5,013,247 | 5/1991 | Watson | 439/55 |
| 5,061,033 | 10/1991 | Richard | 439/911 |
| 5,343,009 | 8/1994 | Araoka et al. | 439/911 |
| 5,373,133 | 12/1994 | Brockway et al. | 200/335 |
| 5,481,634 | 1/1996 | Anderson et al. | 385/76 |
| 5,597,991 | 1/1997 | Chen et al. | 200/50.02 |
| 5,664,955 | 9/1997 | Arnett | 174/67 |
| 5,675,475 | 10/1997 | Mazura et al. | 361/798 |

*Primary Examiner*—Donald Sparks
*Assistant Examiner*—Boris L. Chervinsky
*Attorney, Agent, or Firm*—Gregory J. Murgia

[57] ABSTRACT

A protection assembly for connectors is included on a circuit pack to prevent damage caused when a connector is removed while signal power is still being supplied to the circuit pack. More specifically, the protection assembly is disposed on the front side of the circuit pack to prevent access to the connector until signal power is automatically cut off from the circuit pack. In one embodiment, the circuit pack is the type having a lever arrangement capable of causing the circuit pack to engage and disengage the backplane of an equipment frame. When the circuit pack is engaged in the backplane, signal power is supplied through the connector that is accessible, for example, on the face plate of the circuit pack. The protection assembly includes a first shield member mounted on the face plate of the circuit pack in a location adjacent to the connector. The protection assembly further includes a second shield member mounted or otherwise formed on the lever arrangement. When the circuit pack is engaged in the backplane, the first and second shield members cooperate to prevent access to the connector protected thereunder. To expose the connector, a technician would have to operate the lever arrangement to separate the first and second shield members. Because the circuit pack is disengaged from the backplane by action of the lever arrangement, signal power supplied to the connector is therefore automatically cut off before the first and second shield members are separated to expose the connector.

25 Claims, 17 Drawing Sheets

100

100

APPARATUS FOR PROTECTING CONNECTORS ON CIRCUIT PACKS

FIELD OF THE INVENTION

This invention relates generally to communications systems and, more specifically, to protection features for plug-in circuit pack assemblies used in communications systems.

BACKGROUND OF THE INVENTION

Circuit packs used in lightwave communication systems may include optical fiber connections to facilitate the transport of optical signals. For example, an optical fiber carrying an optical signal supplied from a component on a circuit pack may be connected to another optical fiber that transports the optical signal to another circuit pack. In one common arrangement, a connector sleeve is provided on the face plate of the circuit pack to receive connectors on the ends of each of the optical fibers. When the circuit pack is engaged in the backplane of an equipment shelf and receiving power, optical signal power is supplied through the optical fibers and the associated connectors.

The connector sleeve is typically incorporated on the face plate in order to provide easy access for operational and maintenance functions. However, this accessibility can create problems if a technician attempts to remove a connector from the connector sleeve while optical signal power is still being supplied through the optical fibers and associated connectors. For example, the power level of an optical signal may be sufficiently high to cause damage to the fiber core in a connector. As a result, maintenance costs as well as operational downtime may increase while the optical fibers, connectors, or entire circuit pack are being repaired or replaced. Even if the damage does not warrant immediate repair, damaged components may cause other operational problems, such as higher insertion loss for the circuit pack.

Recent developments in optical networking will only increase the likelihood of these types of problems. For example, optical amplifiers and other optical components are now being developed to drive optical signals to even higher output power levels. Multi-wavelength systems are also a concern because total optical power in the optical fiber is the sum of the powers of the individual wavelength components. As the number of wavelength components increases, e.g., from present systems of 16 wavelengths to future systems of 80, 96, and so on, the total output power of optical systems will also increase accordingly. As a result, the potential for damage to optical connectors and other optical components will also increase.

Given the output power levels of current and next generation systems, existing arrangements do not provide adequate protection against damage to connectors and the like. For example, most existing arrangements are based on a manual process in which a technician performs several steps locally at the circuit pack or remotely at a terminal to manually cut off power before removing a connector. Because the connector is exposed and unprotected on the face plate of the circuit pack, the only safeguard for ensuring that a technician does not prematurely remove the connector is typically a warning label placed on the equipment alerting the technician to perform the required steps before removing the connector. Among other obvious shortcomings, this type of arrangement is especially prone to human error, e.g., if a technician fails to shut off power for any number of reasons before removing a connector.

Other known equipment protection arrangements include latch and switch mechanisms that interact to interrupt electrical power during insertion and removal of a circuit board. However, these arrangements do not protect against damage to connectors that are accessible on the face plate of a circuit pack.

SUMMARY OF THE INVENTION

Damage caused by removing an optical fiber from a circuit pack while power is still being supplied to the circuit pack is substantially eliminated according to the principles of the invention by using a protection assembly disposed on the front side of the circuit pack that prevents access to the optical fiber connector until after signal power supplied through the connector is automatically cut off. By automatically disconnecting power before allowing access to the optical fiber connector, the protection assembly eliminates the opportunity for human error as in prior arrangements.

In one exemplary embodiment, the circuit pack is of the type having a lever arrangement capable of causing the circuit pack to engage and disengage the backplane of an equipment frame. When the circuit pack is engaged in the backplane, optical signal power is supplied through an optical fiber connector that is accessible on the face plate of the circuit pack. The protection assembly includes a first shield member mounted on the face plate of the circuit pack in a location adjacent to the optical fiber connector. The protection assembly further includes a second shield member mounted or otherwise formed on the lever arrangement.

When the circuit pack is engaged in the backplane, the first and second shield members cooperate to prevent access to the optical fiber connector protected thereunder. To expose the optical fiber connector, a technician would have to operate the lever arrangement to separate the first and second shield members. Because the circuit pack is disengaged from the backplane by action of the lever arrangement, optical signal power supplied through the optical fiber connector is therefore automatically cut off before the first and second shield members are separated to expose the fiber connector. More specifically, optical signal power being supplied by a component on the circuit pack through the optical fiber connector is cut off as a result of power to the component being disconnected when the circuit pack is disengaged from the backplane.

BRIEF DESCRIPTION OF THE DRAWING

A more complete understanding of the principles of the invention may be obtained from consideration of the following detailed description in conjunction with the drawing, with like elements referenced with like references, in which.

DETAILED DESCRIPTION OF THE INVENTION

Although the principles of the invention are particularly well-suited for use in the optical domain, and shall be described in this context, those skilled in the art will understand that the teachings of the present invention are also applicable in the electrical domain. For example, embodiments are shown and described herein in terms of optical fiber connectors, optical signals, and optical signal power; however, the principles of the invention are also applicable to circuit packs or circuit boards having electrical connectors for coupling electrical signals. Accordingly, the embodiments shown and described herein are only meant to be illustrative and not limiting.

Figure 1A:
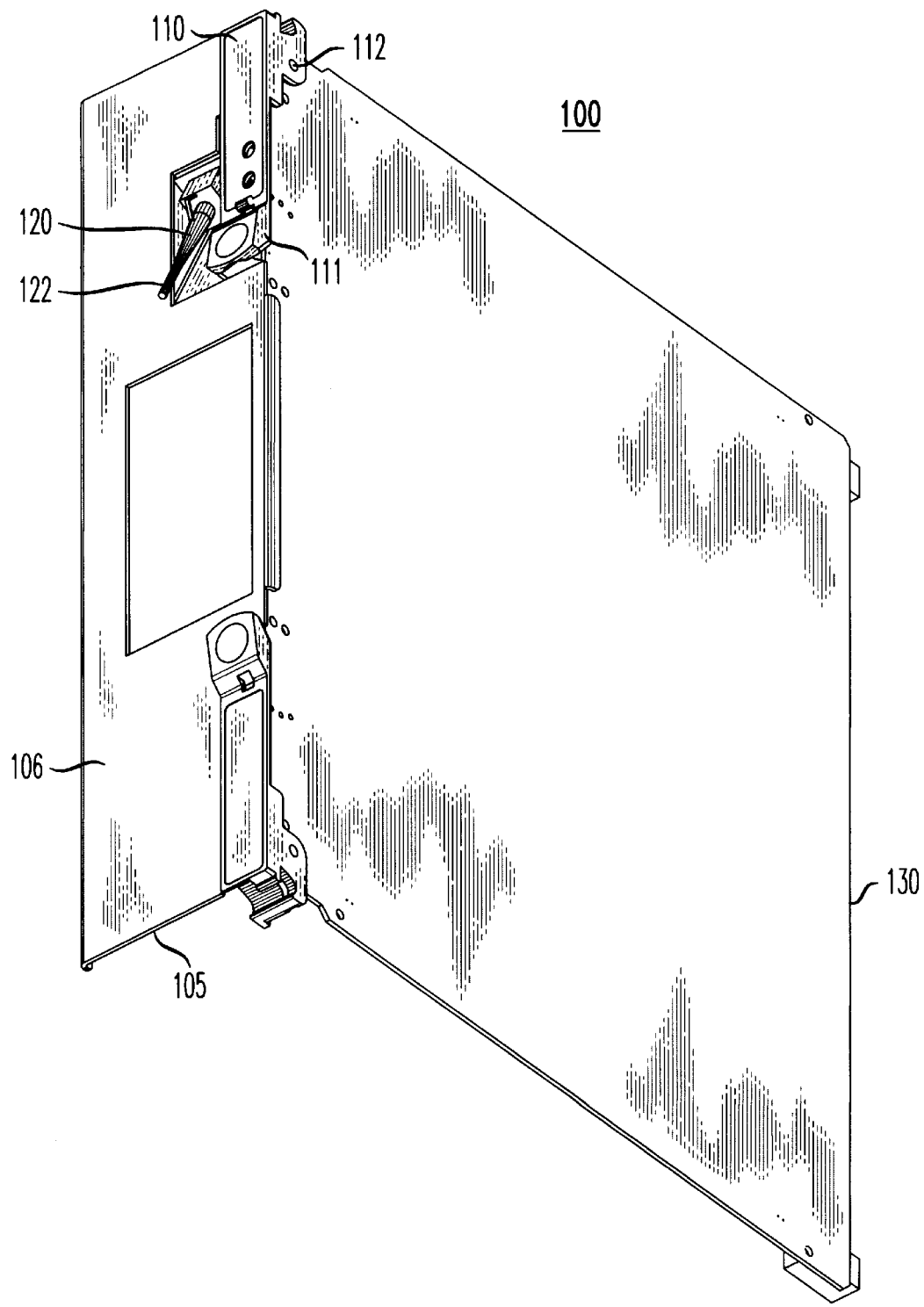
FIGS. 1A and 1B show a perspective view of a typical circuit pack including an optical fiber connector accessible through the face plate of the circuit pack.
Figure 1B:
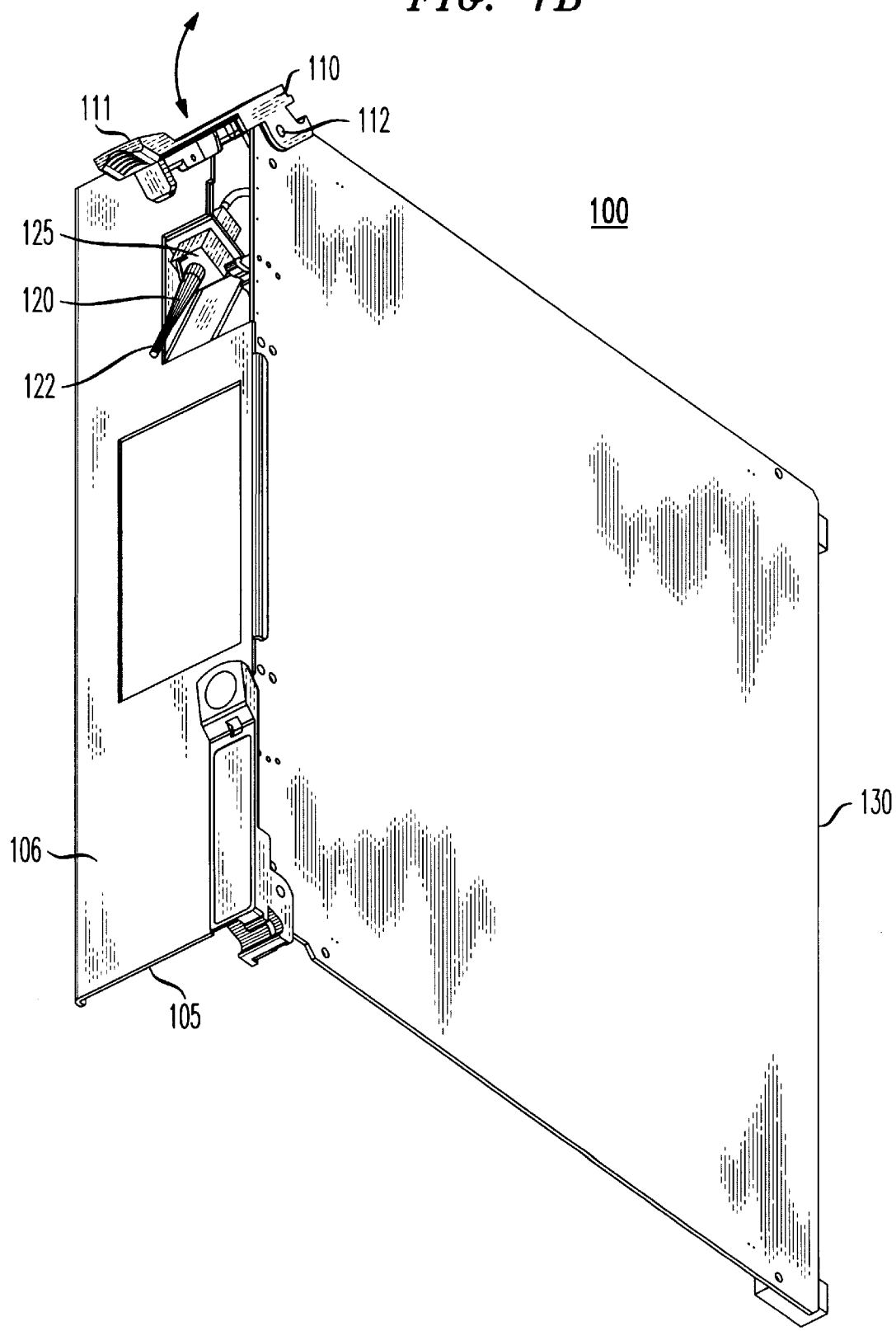

As shown in FIGS. 1A and 1B, a typical circuit pack 100 includes a face plate 105, a lever assembly 110, and a connector sleeve 125 accessible through face plate 105. Connector sleeve 125 is shown to receive optical fiber connector 120 of optical fiber 122. Lever assembly 110 can be any of several well-known latch or lever arrangements used to facilitate the insertion and extraction of circuit packs or circuit boards in equipment shelves. In particular, using well-known principles of operation, lever assembly 110 facilitates the engagement and disengagement of plug-in connectors (not shown) on edge 130 of circuit pack 100 in a backplane of an equipment shelf (not shown). For example, circuit pack 100 would be engaged in the backplane when lever assembly 110 is in the closed position as shown in FIG. 1A. Conversely, circuit pack 100 would be disengaged from the backplane when lever assembly 110 is in the open position as shown in FIG. 1B.

In one exemplary embodiment, lever assembly 110 includes lever arm 111 that is rotatably attached to circuit pack 100 at pivot point 112 and is accessible on the front side 106 of face plate 105. Using well-known techniques, application of force to lever arm 111 imparts the appropriate rotational forces about pivot point 112 to facilitate removal and insertion of circuit pack 100 from the backplane of the equipment shelf (not shown). It should be noted that many well-known latch and lever arrangements are contemplated for use with the embodiments shown and described herein. For an example of a typical latching arrangement, see, e.g., U.S. Pat. No. 4,614,389 issued to Albert et al., which is incorporated by reference herein.

Figure 2:
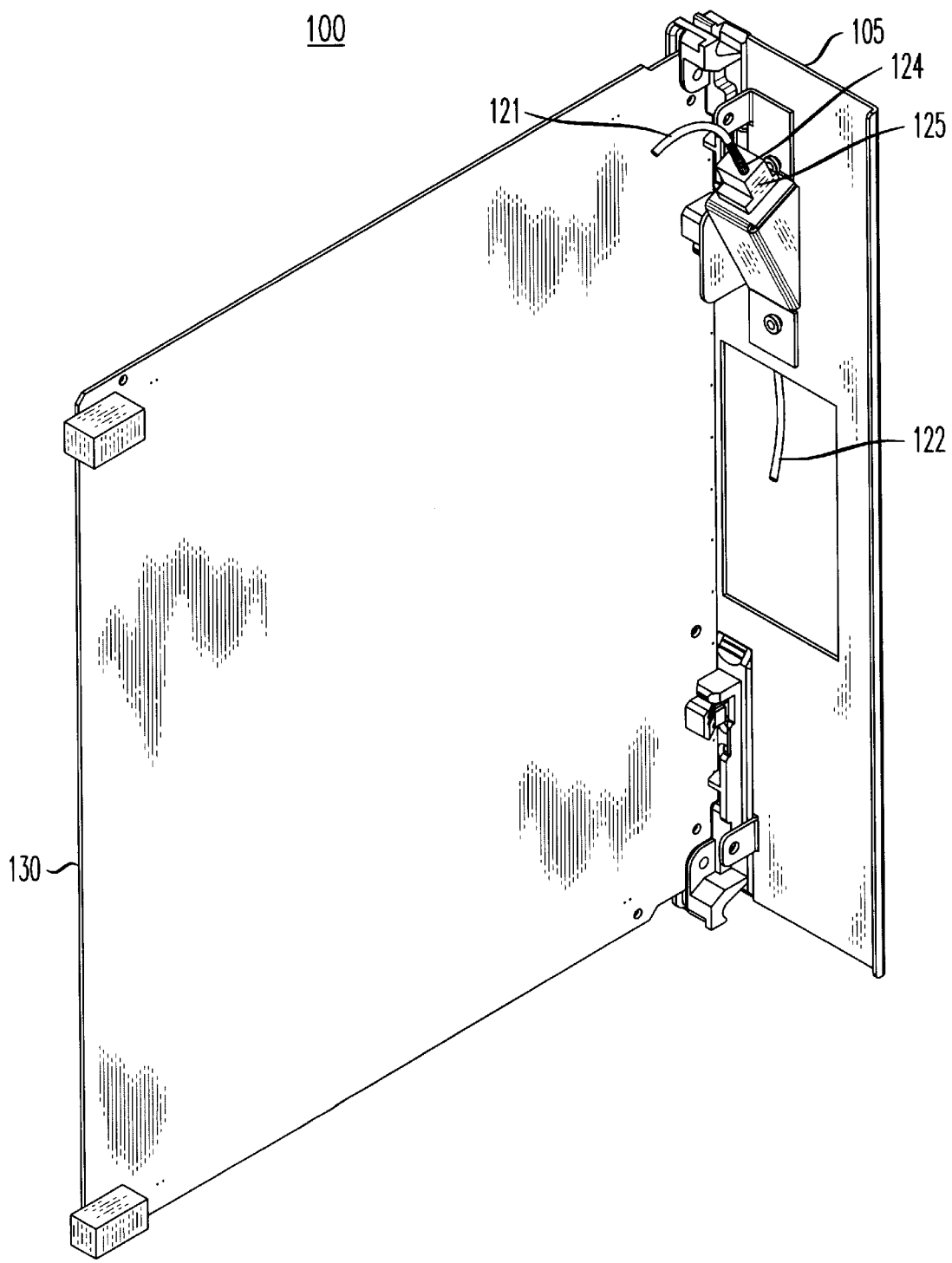
FIG. 2 shows another perspective view of a typical circuit pack.

As illustrated in FIG. 2, connector sleeve 125 in a lightwave communication system is generally used for receiving optical fiber connectors 124 and 120 of optical fibers 121 and 122 respectively. Various types of optical fiber connectors and connector sleeves and the operation thereof are well-known in the art. See, e.g., U.S. Pat. No. 4,812,009 issued to Carlisle et al. and U.S. Pat. No. 5,481,634 issued to Anderson et al., both of which are incorporated by reference herein. Optical fiber 121 is typically coupled to a component (not shown) disposed on circuit pack 100. For example, optical fiber 121 may receive an amplified optical signal supplied from an optical amplifier on circuit pack 100. Optical fiber 122 may be used for coupling the optical signal to another circuit pack or element of the lightwave communication system. For purposes of this description, optical fiber 122, optical fiber connector 120, and a portion of connector sleeve 125 are assumed to be accessible via the front side 106 of face plate 105 so that a technician or system operator may remove optical fiber connector 120 from connector sleeve 125 whether circuit pack 100 is engaged or disengaged from the backplane of an equipment shelf.

In operation, optical signal power may be supplied through optical fiber 121 and optical fiber 122 and the associated connectors when edge 130 of circuit pack 100 is engaged in a backplane of an equipment shelf (not shown). For example, components on circuit pack 100 may receive power when edge 130 of circuit pack 100 is engaged in the backplane of the equipment shelf As a result, a component coupled to optical fiber 121 will supply optical signal power through optical fiber 121 and through optical fiber connector 120. When edge 130 of circuit pack 100 is disengaged from the backplane using lever assembly 110, power is cut off to circuit pack 100 and to all components thereon so that optical signal power is no longer supplied through optical fiber 121, optical fiber connector 124, optical fiber connector 120, and optical fiber 122.

Figure 4:
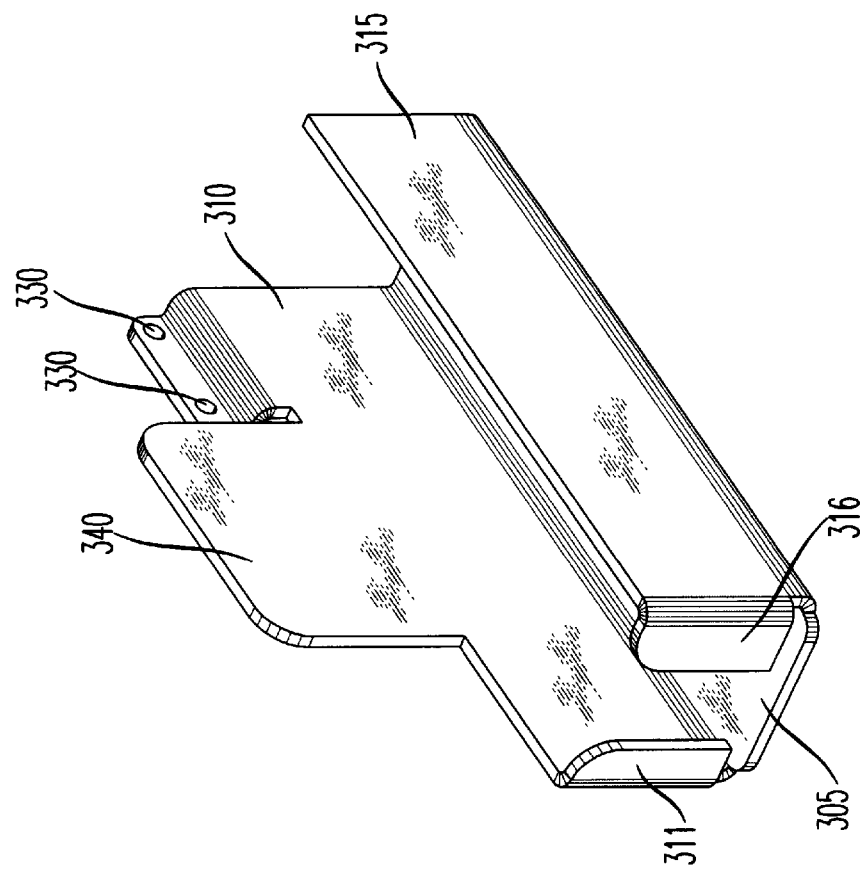
FIG. 4 is a perspective view of one embodiment of the second shield member which is used in conjunction with a lever assembly of a circuit pack according to the principles of the invention.
Figure 3:
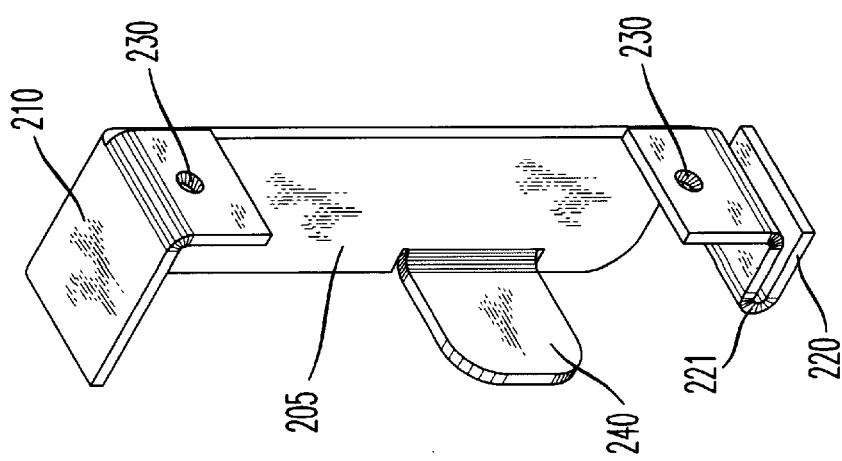
FIG. 3 shows a perspective view of one embodiment of the first shield member which is used in conjunction with a face plate of a circuit pack according to the principles of the invention.

FIGS. 3 and 4 show one embodiment of the protection assembly according to the principles of the invention. More specifically, FIG. 3 shows a first shield member 200 of the protection assembly including a side portion 205, two opposing end portions 210 and 220 extending from opposite ends of side portion 205, apertures 230 formed within a portion of each end portion 210 and 220 for receiving fasteners and the like, and an optional protection tab 240 extending from side portion 205 at a point intermediate to end portions 210 and 220. End portion 220 is also shown to have a curved portion 221 which will be described in more detail below. First shield member 200 only represents one exemplary embodiment and various modifications may be made to the design consistent with the principles of the invention. For example, first shield member 200 is preferably single-piece construction to simplify design and manufacturing.

As will be described in more detail below, first shield member 200 is mounted or otherwise attached or formed on face plate 105 of circuit pack 100 (FIGS. 1–2). In one embodiment, first shield member 200 may be mounted to face plate 105 using fasteners (not shown) that extend through apertures 230. The other features of first shield member 200 will be described in more detail below in the context of circuit pack 100.

FIG. 4 shows a second shield member 300 of the protection assembly including a front portion 305, two opposing side portions 310 and 315 extending from opposite sides of front portion 305, the front portion 305 and two side portions 310 and 315 together forming a rectangular-shaped enclosure therein, apertures 330 formed within side portion 310 for receiving fasteners and the like, and an optional protection tab 340. Each side portion 310 and 315 is shown to have an extended portion 311 and 316, respectively, both of which are located on a same end of second shield member 300. Extended portions 311 and 316 are formed so as to define an opening therebetween through which an optical fiber can pass. Second shield member 300 only represents one exemplary embodiment and various modifications may be made to the design consistent with the principles of the invention. For example, second shield member 300 is shown to be preferably single-piece construction to simplify design and manufacturing.

As will be described in more detail below, second shield member 300 is mounted or otherwise attached or formed on lever assembly 110 of circuit pack 100 (FIGS. 1–2). In one embodiment, second shield member 300 may be mounted to lever assembly 110 using fasteners (not shown) that extend through apertures 330. The other features of second shield member 300 will be described in more detail below in the context of circuit pack 100.

Figure 5:
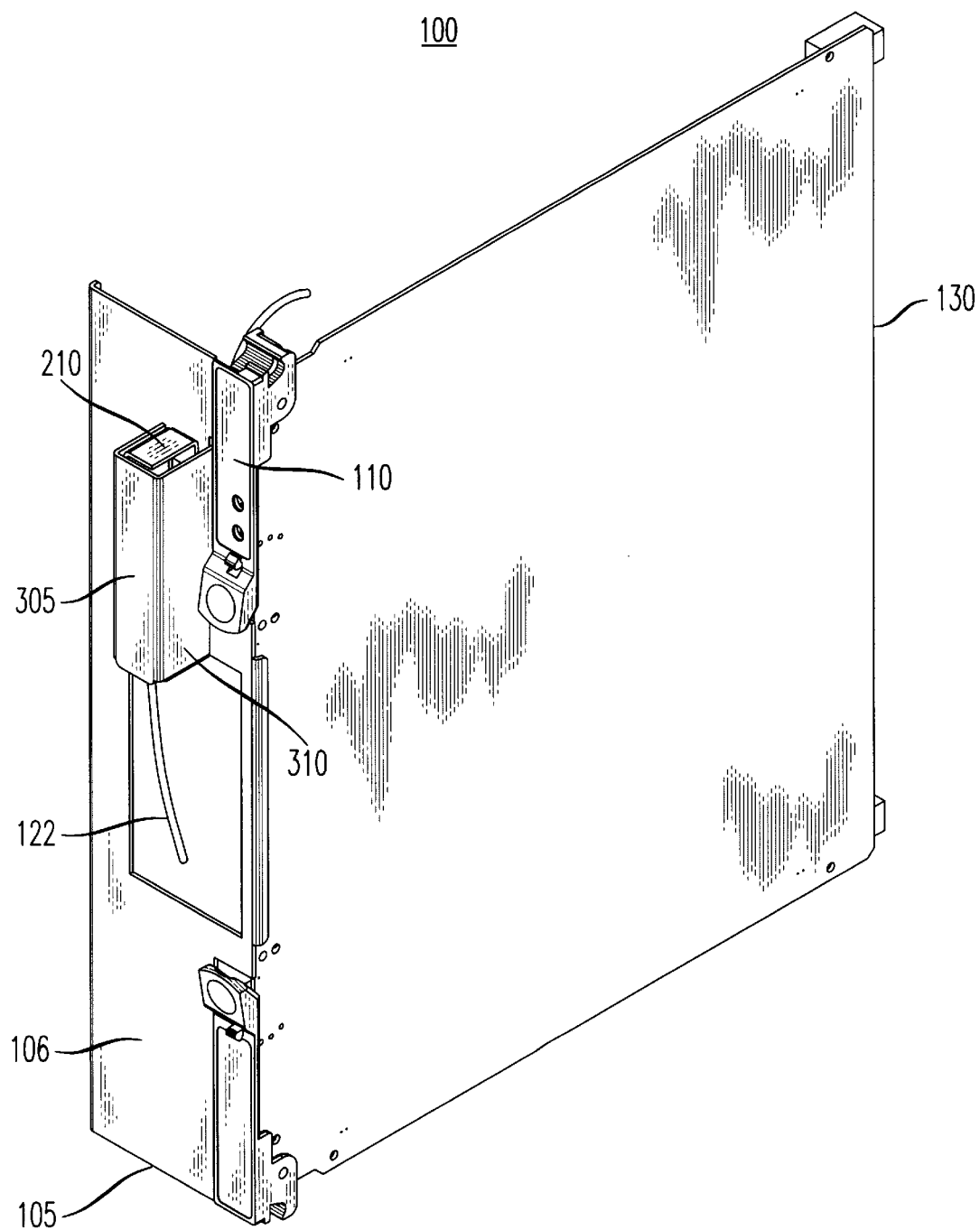
FIG. 5 shows a perspective view of the circuit pack of FIGS. 1 and 2 with a protection assembly according to the principles of the invention.

FIG. 5 shows circuit pack 100 with the protection assembly according to the principles of the invention. More specifically, end portion 210 of first shield member 200 and front portion 305 and side portion 310 of second shield member 300 are shown in this view of the protection assembly. As shown, when lever assembly 110 is in the closed position, e.g., when edge 130 of circuit pack 100 is engaged in the backplane of an equipment shelf (not shown), first shield member 200 and second shield member 300 cooperate together to prevent access to optical fiber connector 120 (not shown) protected thereunder. As a result, a technician cannot gain access to optical fiber connector 120 to remove optical fiber 122 while circuit pack 100 is receiving power.

Figure 6:
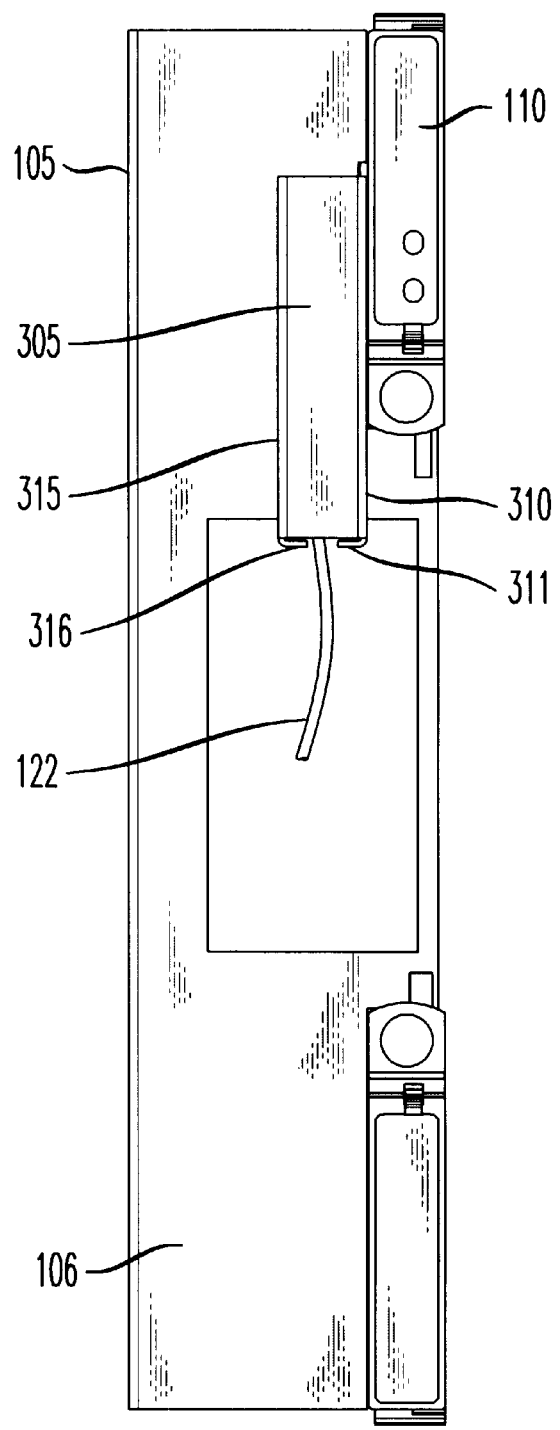
FIG. 6 shows a front elevation view of the circuit pack with the protection assembly according to the principles of the invention in which the optical fiber connector is not externally accessible.

FIG. 6 shows front side 106 of face plate 105 on circuit pack 100 when the protection assembly is used according to the principles of the invention to prevent access to optical fiber connector 120 (not shown). More specifically, front portion 305 and extended portions 311 and 316 of second shield member 300 of the protection assembly are shown. Optical fiber 122 extends through the opening defined between extended portions 311 and 316. Importantly, a technician cannot gain access to and remove optical fiber connector 120 from connector sleeve 125 while optical signal power is still being transmitted. Extended portions 311 and 316 are optional features of second shield member 300 which can be used to prevent inadvertent access to optical fiber connector 120. For example, extended portions 311 and 316 can prevent the insertion of a finger or a tool between side portions 310 and 315 of second shield member 300.

Figure 7:
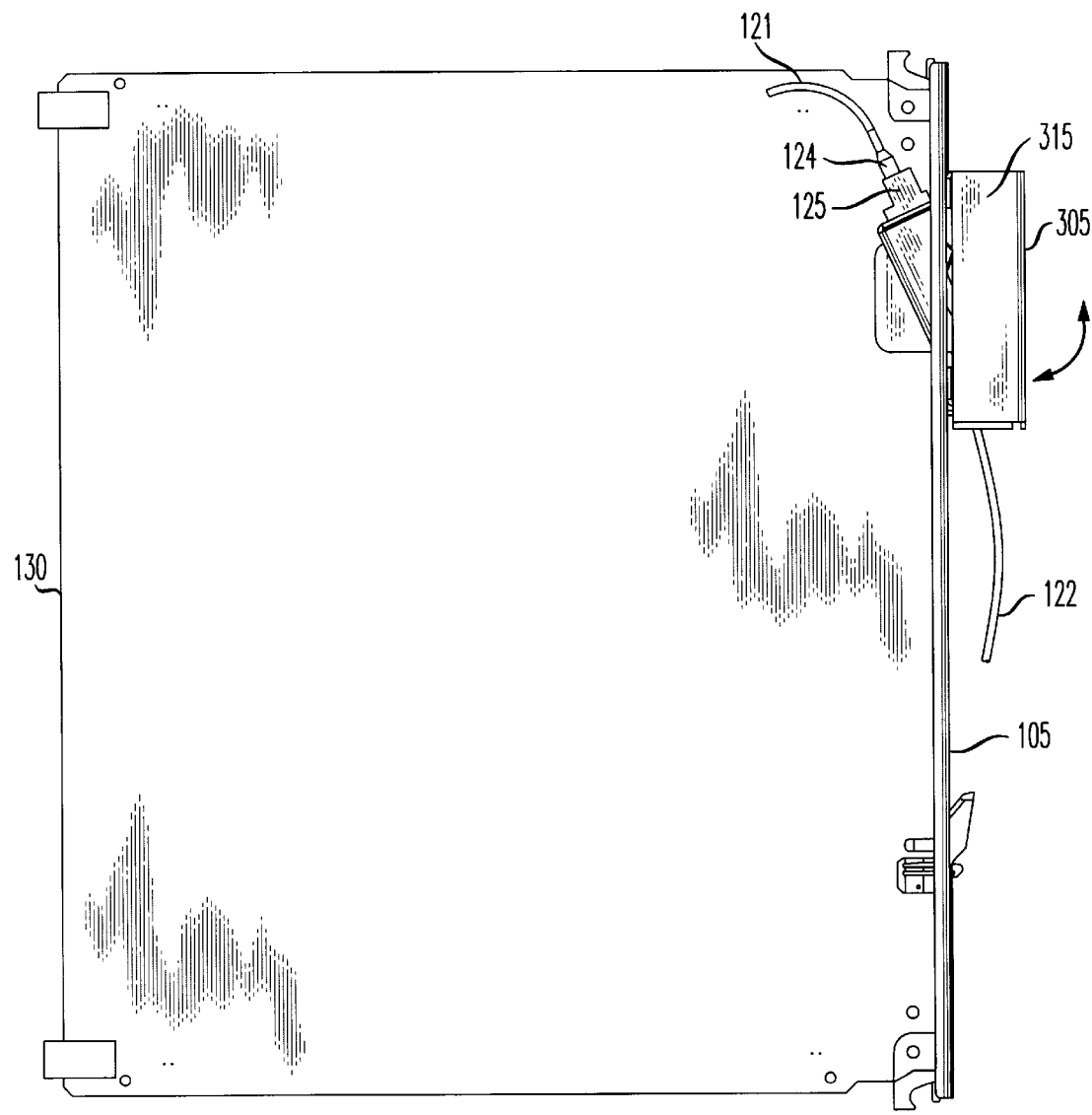
FIGS. 7 and 8 are side elevation views of the circuit pack and protection assembly according to the principles of the invention in which the optical fiber connector is not externally accessible.
Figure 8:
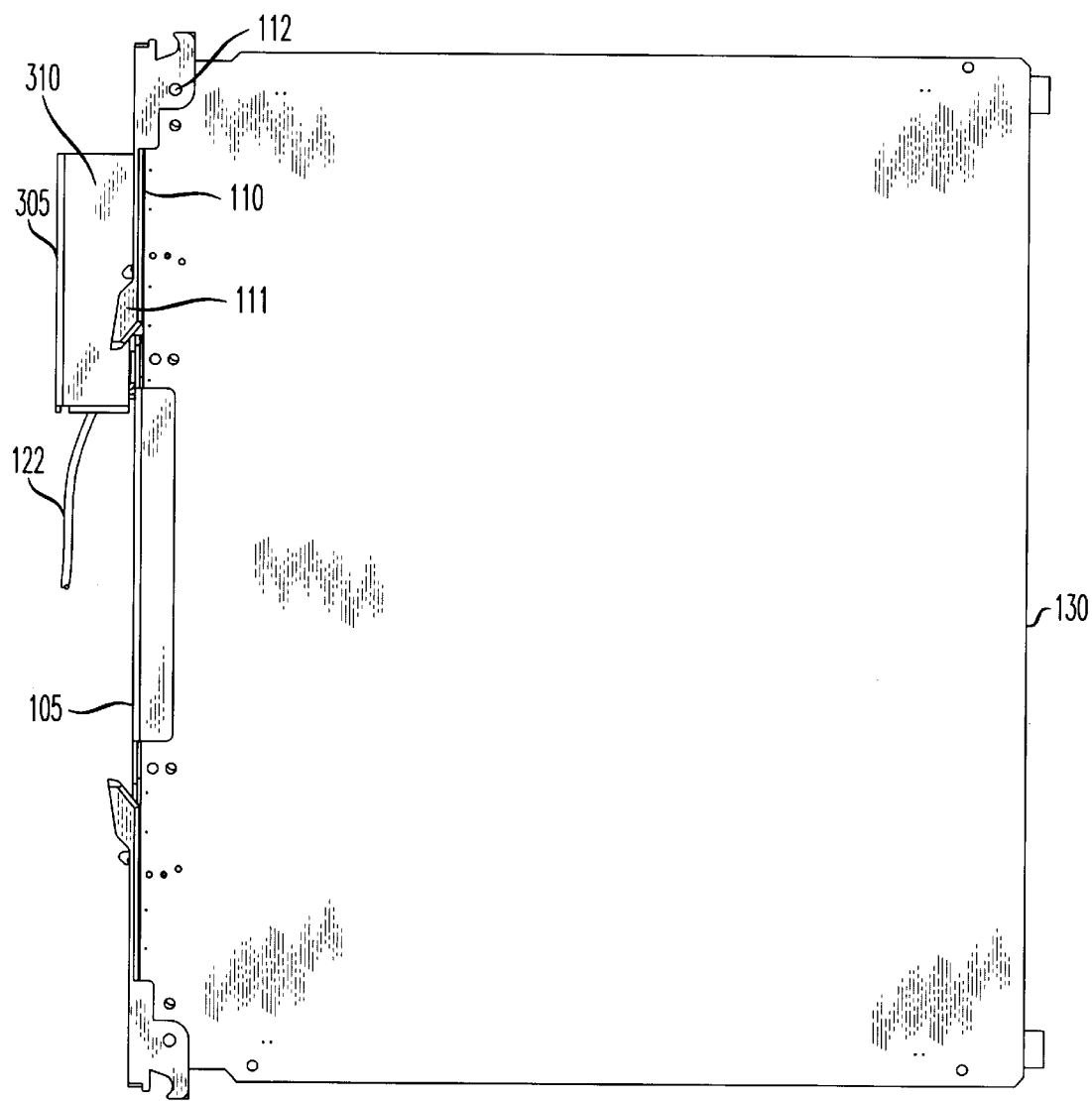

FIGS. 7 and 8 are side views of circuit pack 100 when optical fiber connector 120 (not shown) is not accessible. More specifically, FIG. 7 shows side portion 315 and front portion 305 of second shield member 300. As shown, second shield member 300 is in a closed position to prevent access to optical fiber connector 120 from the front of face plate 105. FIG. 8 shows side portion 310 and front portion 305 of second shield member 300 in addition to lever arm 111 and pivot point 112 of lever assembly 110. In both FIGS. 7 and 8, lever assembly 110 is shown in the closed position, i.e., circuit pack 100 engaged in the backplane of an equipment shelf using lever arm 111 and pivot point 112. Accordingly, a technician cannot remove optical fiber connector 120 (not shown) from connector sleeve 125 while optical signal power is being transmitted.

Figure 9A:
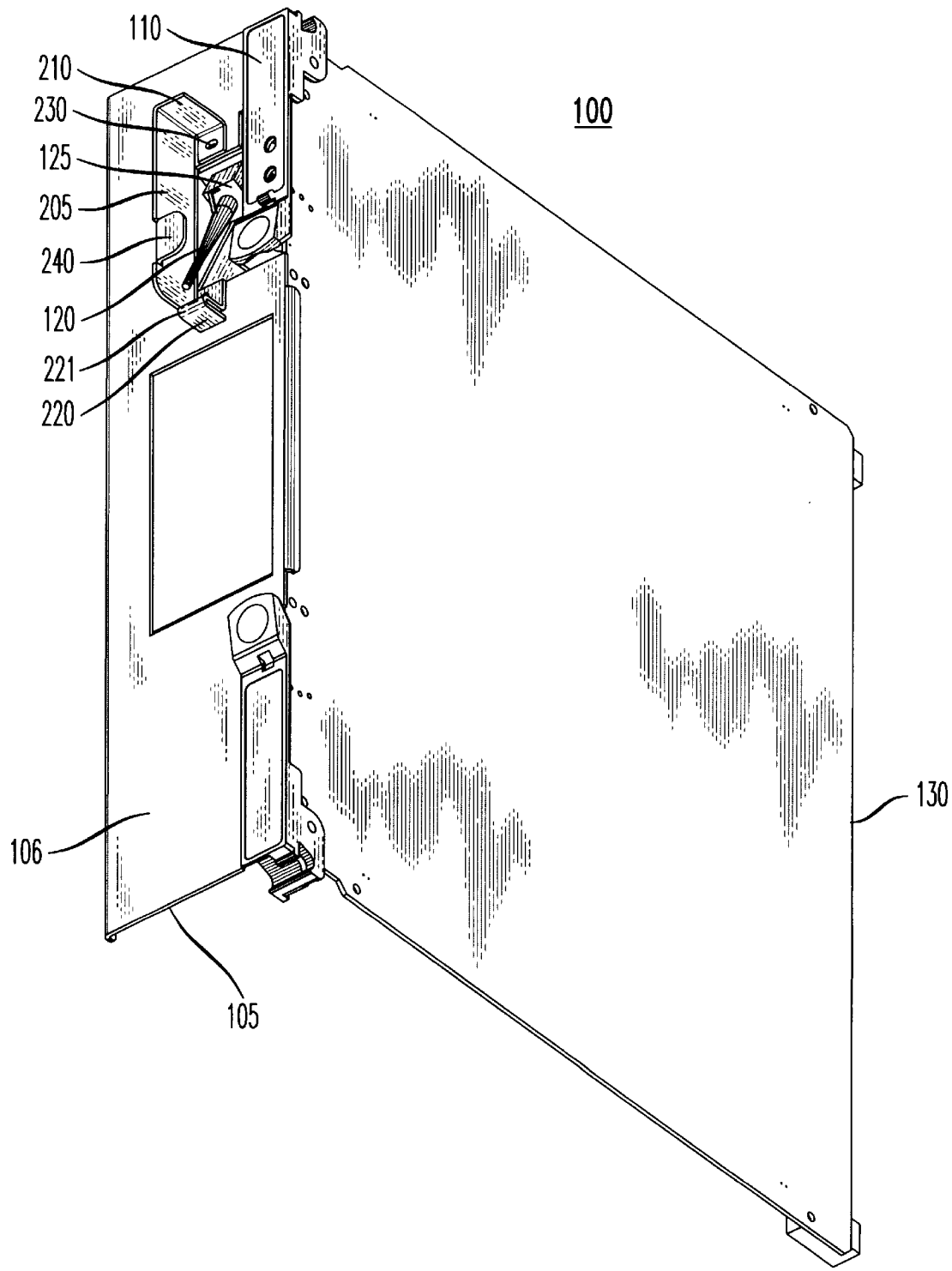
FIGS. 9A and 9B are perspective views of the circuit pack showing a first shield member mounted on the face plate of the circuit pack according to the principles of the invention.
Figure 9B:
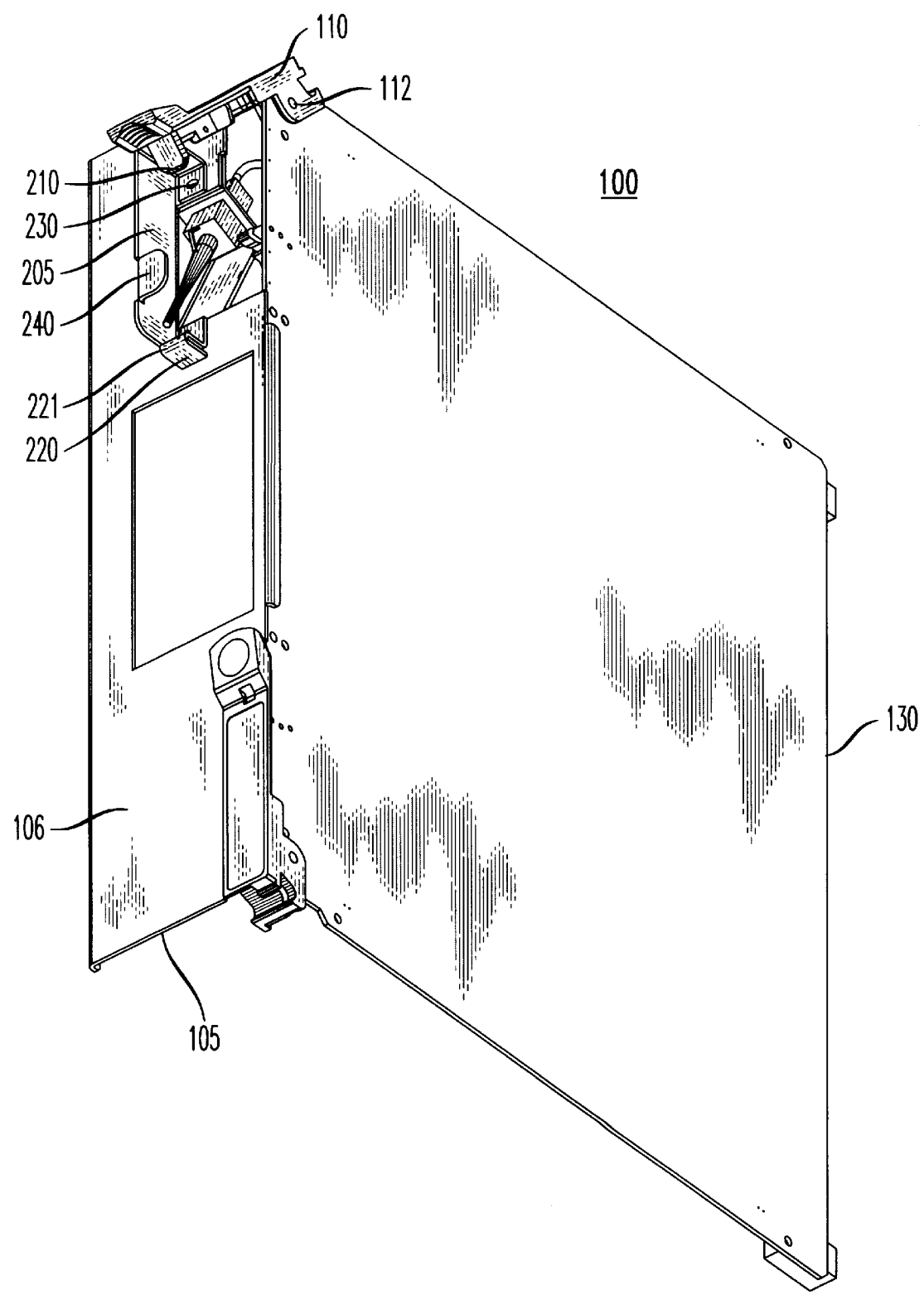

As shown in FIGS. 9A (lever assembly 110 in closed position) and 9B (lever assembly 110 in open position), first shield member 200 is mounted on face plate 105 of circuit pack 100. More specifically, end portions 210 and 220 include portions that are aligned flush with front side 106 of face plate 105 so that side portion 205 is in a position perpendicular to face plate 105 and adjacent to optical fiber connector 120. In this way, first shield member 200 therefore prevents access to optical fiber connector 120 from one point of entry, i.e., from one side of circuit pack 100. Similarly, end portion 210 of first shield member 200 prevents access to optical fiber connector 120 from one point of entry, i.e., from the top of circuit pack 100. The function of optional protection tab 240 and curved portion 221 will be described in more detail below.

As previously described, first shield member can be mounted or otherwise attached to face plate 105 in a number of different ways. In one embodiment, first shield member 200 can be removably attached using fasteners that extend through apertures 230 for securing to face plate 105. This embodiment is particularly advantageous for retrofit applications in which face plate 105 has already been fabricated. In another embodiment, first shield member may be formed as part of face plate 105 during the manufacturing process. For example, first shield member 200 and face plate 105 may comprise a single, unitary construction (e.g., through molding).

Figure 10:
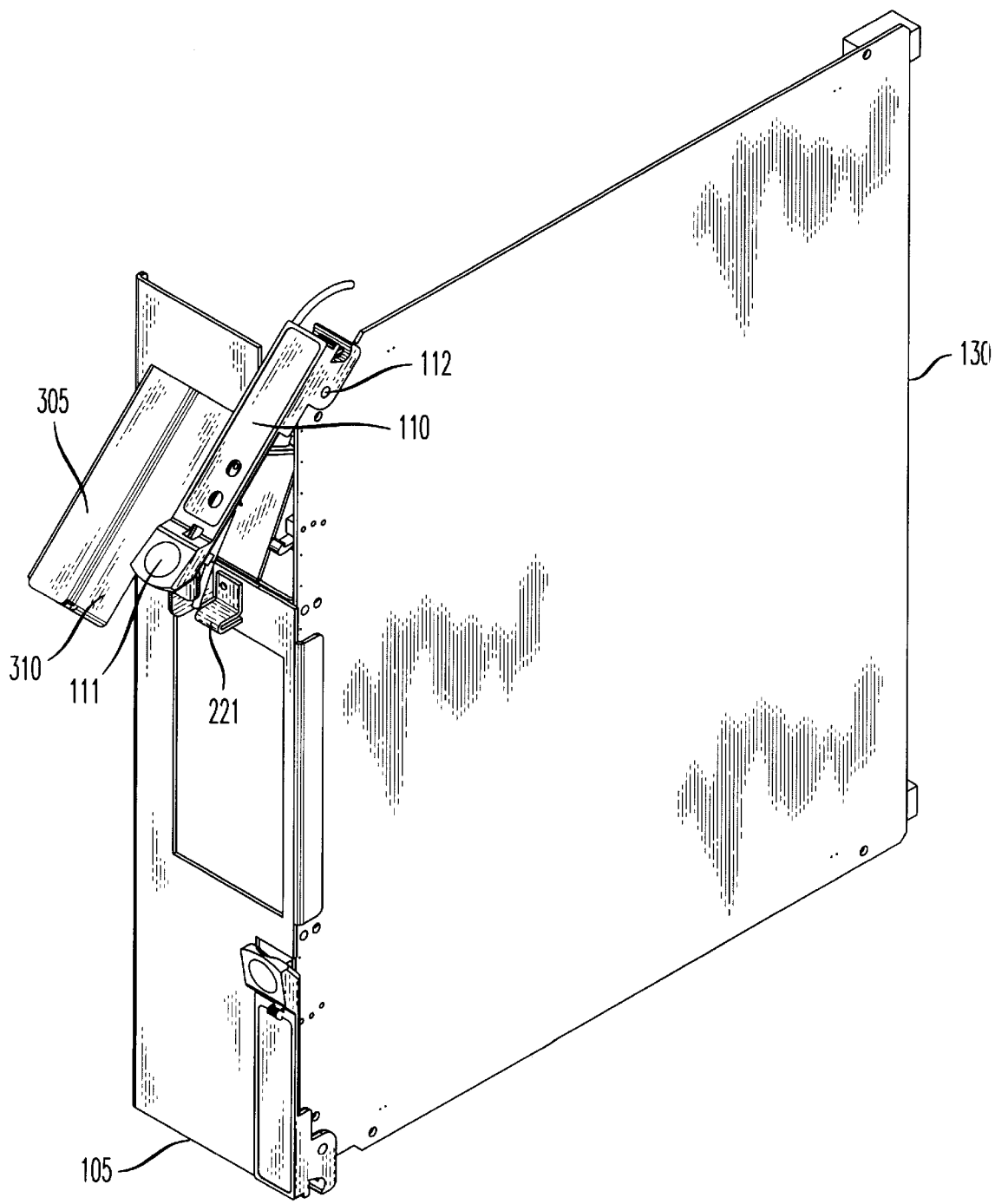
FIG. 10 is a perspective view of the circuit pack showing a second shield member mounted on the lever assembly of the circuit pack according to the principles of the invention.

FIG. 10 shows second shield member 300 mounted on lever assembly 110 of circuit pack 100 according to the principles of the invention. More specifically, front portion 305 and side portion 310 of second shield member 300 are shown. As previously described, second shield member 300 can be mounted or otherwise attached or formed with lever assembly 110 by any of a number of different techniques. In the preferred embodiment for retrofit applications and for those in which lever assembly 110 has already been fabricated, second shield member 300 may be removably attached to lever assembly 110 using fasteners (not shown) that extend through apertures 330 (not shown) of side portion 310 for securing to lever assembly 110. Other features shown in FIG. 10 have been previously described.

Figure 11:
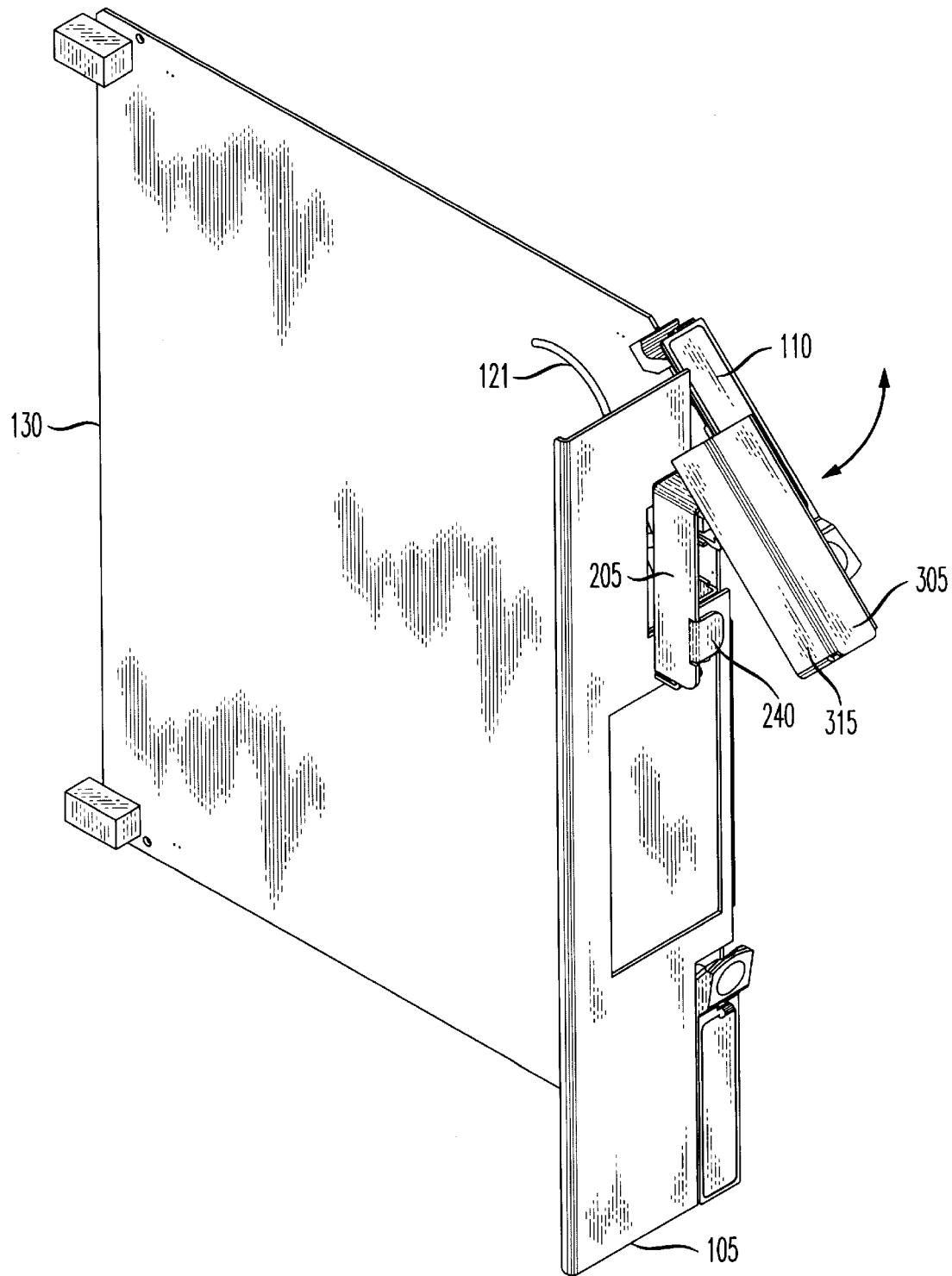
FIG. 11 shows a perspective view of the circuit pack with the protection assembly according to the principles of the invention in which the optical fiber connector is externally accessible.

In FIG. 11, both first shield member 200 (side portion 205 and protection tab 240) and second shield member 300 (front portion 305 and side portion 315) are shown with lever assembly 110 being in the open position, e.g., when edge 130 of circuit pack 100 is disengaged from the backplane of an equipment shelf and not receiving power. As shown, the operation of lever assembly 110 (e.g., upward lifting) to disengage circuit pack 100 from the backplane causes second shield member 300 to lift away from first shield member 200, thereby exposing optical fiber connector 120 (not shown).

Side portion 205 and protection tab 240 of first shield member 200 are used to prevent access to optical fiber connector 120 until lever assembly 110 has been rotated upward enough to disengage circuit pack 100 from the backplane and cut off power being supplied to circuit pack 100 and optical signal power being supplied through optical fiber connector 120. For example, without side portion 205, a technician may be able to access optical fiber connector 120 at a point when lever assembly 110, and consequently second shield member 300, have been lifted enough to allow access but prior to circuit pack 100 being completely disengaged from the backplane to cut off the flow of power. Protection tab 240 serves a similar purpose by providing additional protection from another direction of entry until lever assembly 110 has been lifted enough to disengage circuit pack 100 and cut off power.

First shield member 200, second shield member 300, and lever assembly 110 should be designed to ensure that reasonable access to optical fiber connector 120 can be prevented until power is cut off to circuit pack 100. In one exemplary embodiment, lever assembly 110 should rotate to facilitate disengagement of circuit pack 100 from the backplane within approximately 25 degrees of rotation.

Figure 12:
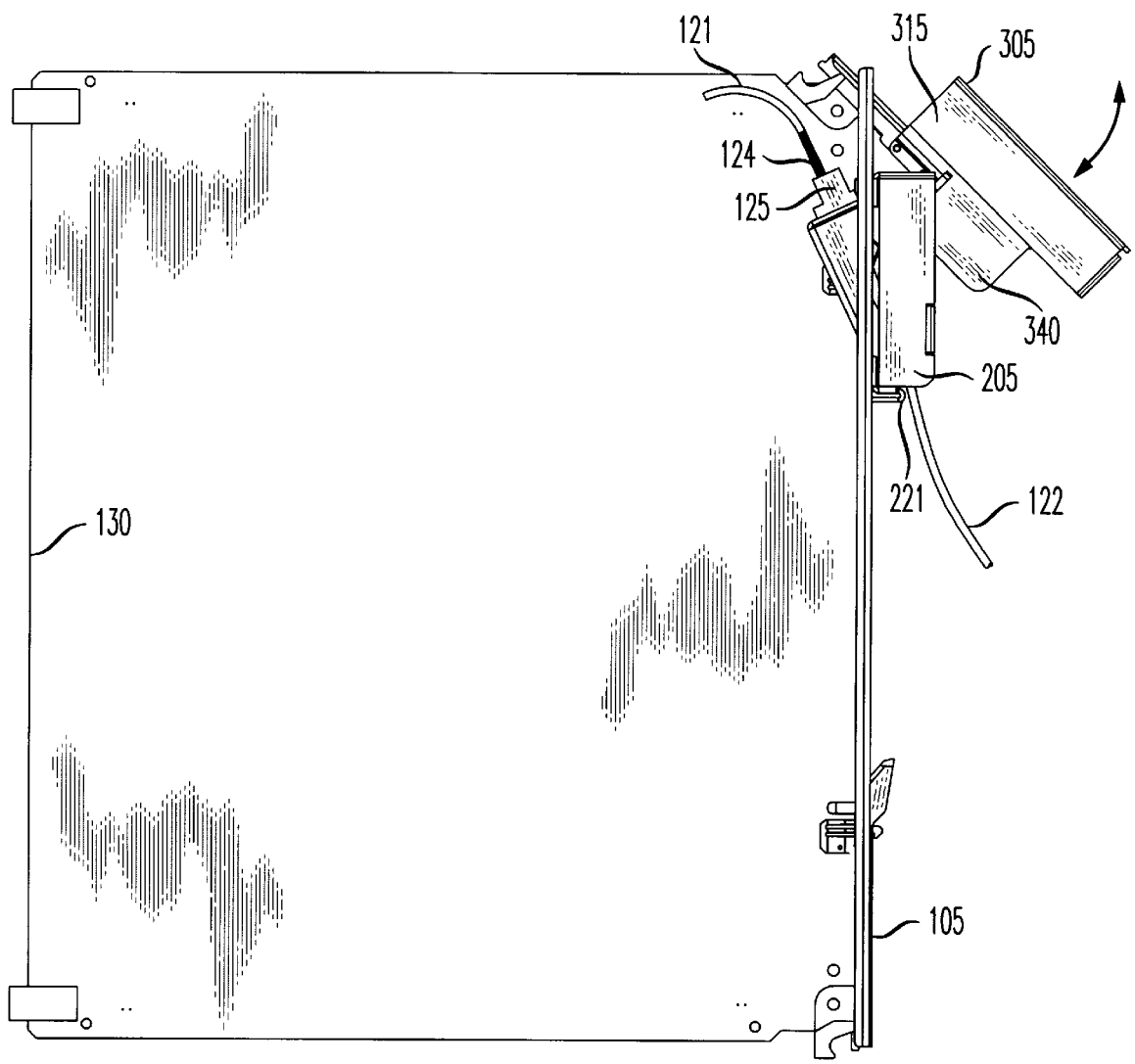
FIGS. 12 and 13 are side elevation views of the circuit pack with the protection assembly according to the principles of the invention in which the optical fiber connector is externally accessible.
Figure 13:
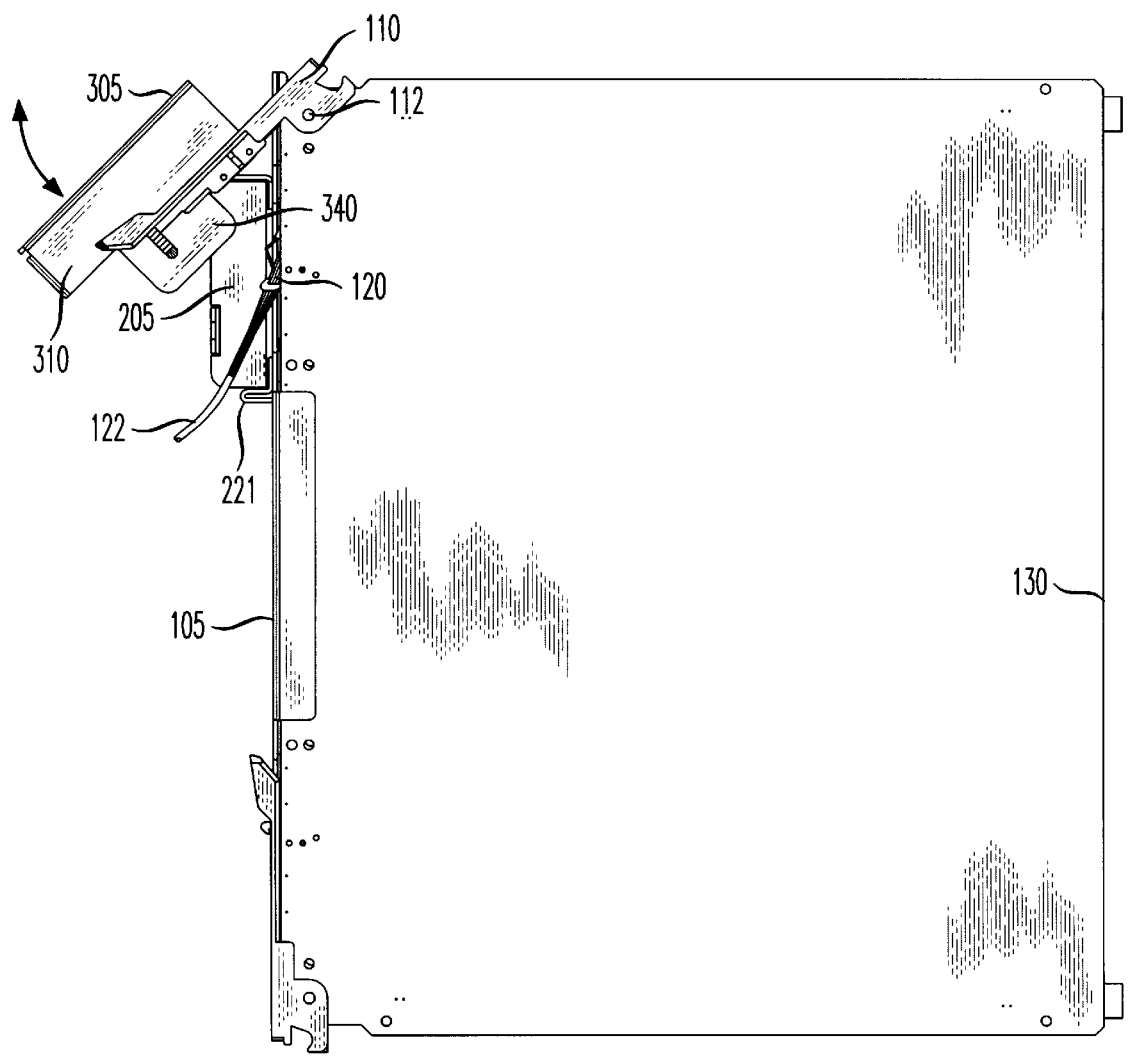

FIGS. 12 and 13 are side views of circuit pack 100 illustrating how optical fiber connector 120 and optical fiber 122 are exposed and accessible when lever assembly 110 is in the open position, e.g., when circuit pack 100 is disengaged from the backplane. In addition to the features previously described, which will not be repeated for sake of brevity, FIGS. 12 and 13 show optical fiber 122 extending away from optical fiber connector 120 in a position near curved portion 221 of first shield member 200 at the front side of face plate 105. Whether lever assembly 110 is in the open or closed position, curved portion 221 ensures that optical fiber 122 is not damaged as a result of scraping against a rough edge of first shield member 200. Consequently, curved portion 221 is optional and provides an additional feature that may be beneficial to the overall operation of the circuit pack. Optional protection tab 340 on second shield member 300 is also shown in FIGS. 12 and 13 to illustrate another feature of the protection assembly. In particular, protection tab 340 performs a similar protection feature as that previously described for protection feature 240 and side portion 205 of first shield member 200.

Figure 14:
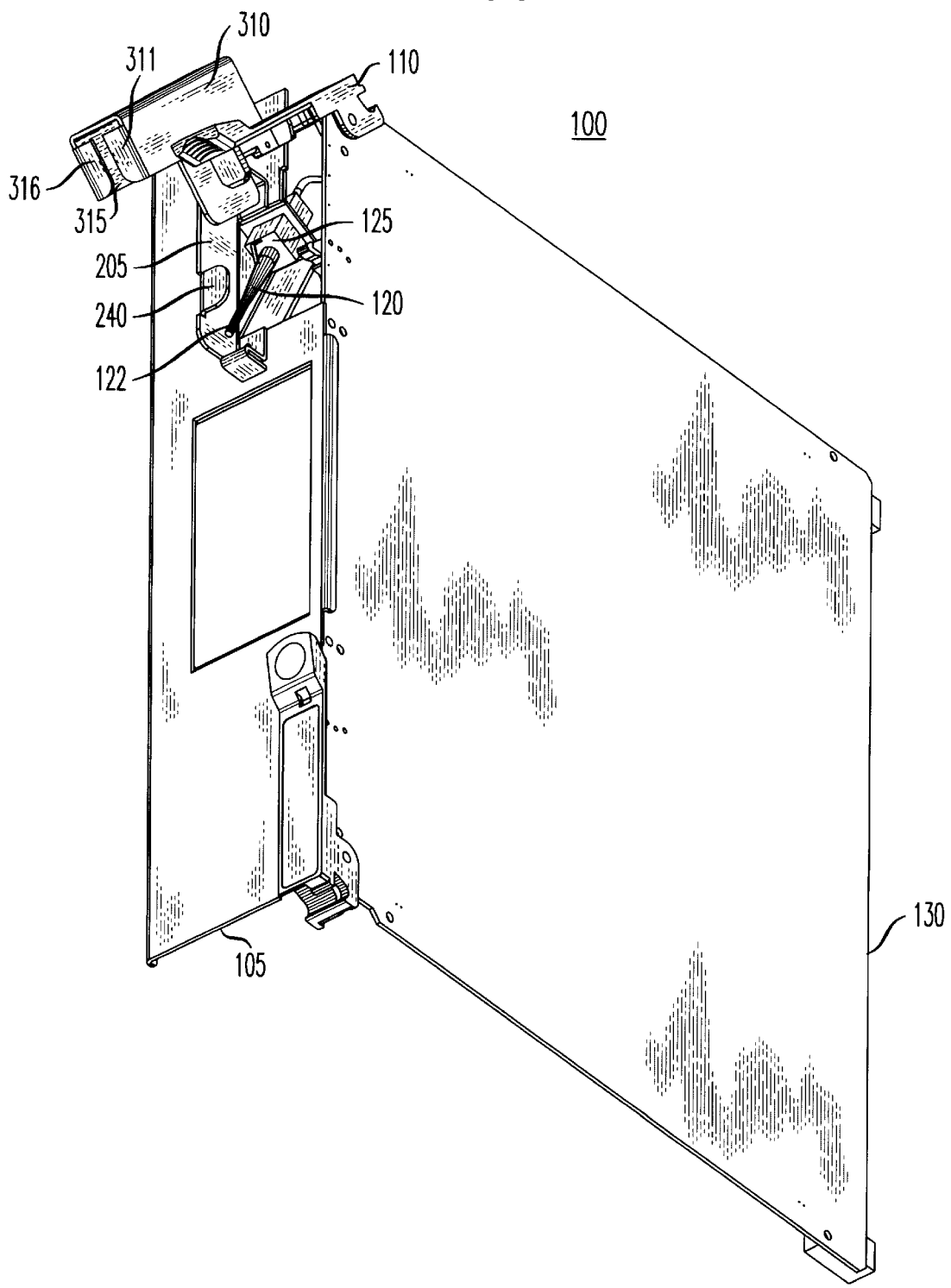
FIGS. 14 and 15 are perspective views of the circuit pack with the protection assembly according to the principles of the invention in which the optical fiber connector is externally accessible.
Figure 15:
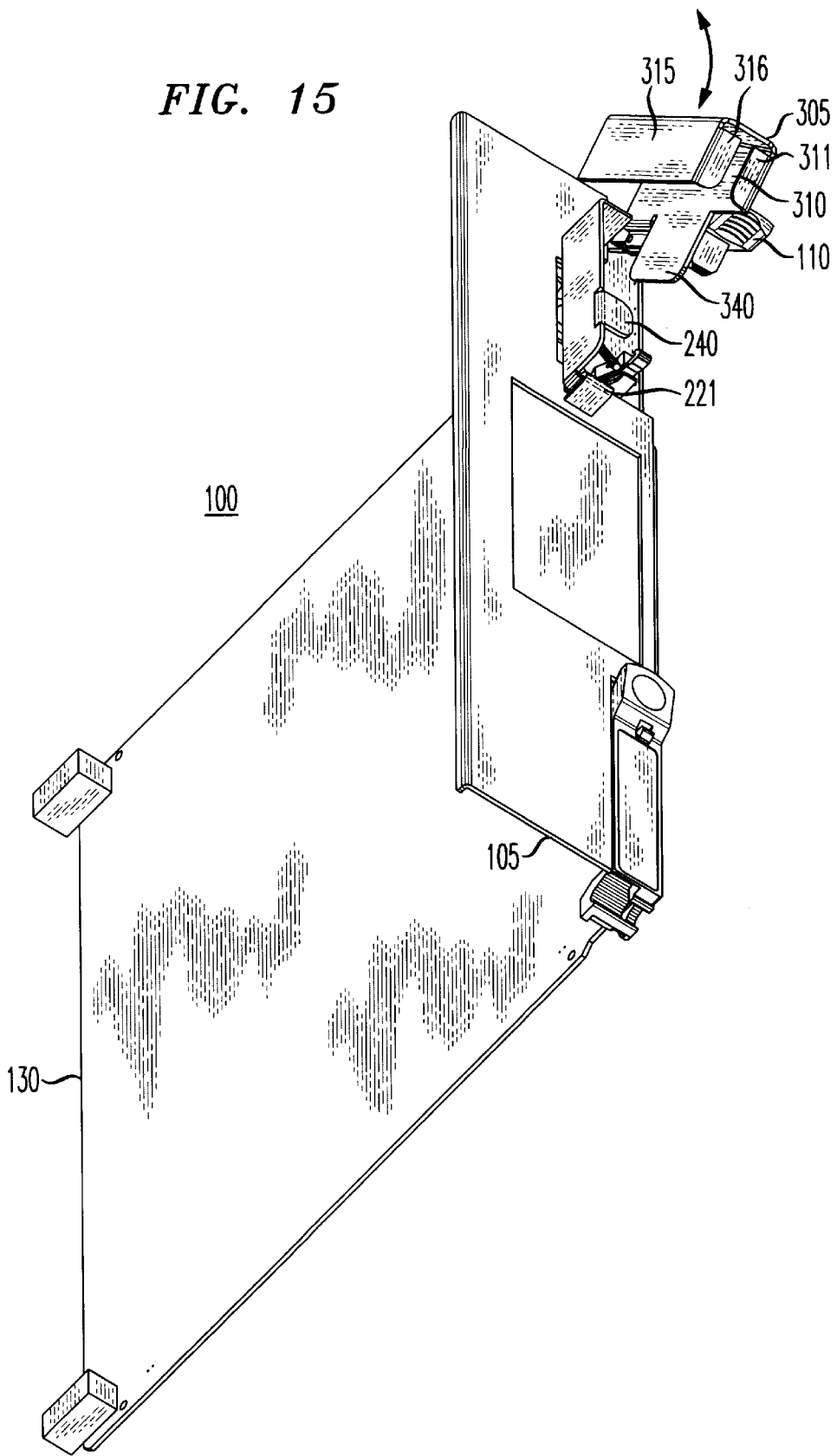

FIGS. 14 and 15 show additional perspective views of circuit pack 100 with lever assembly 110 in the open position and optical fiber connector 120 exposed. A description of the same features previously described will not be repeated for sake of brevity.

In operation (referring to FIGS. 1–15), first shield member 200 is disposed on face plate 105 and second shield member 300 is disposed on lever assembly 110 of circuit pack 100. By actuating lever assembly 110 to insert circuit pack 100 into an equipment frame (e.g. by closing lever assembly 110), second shield member 300 is closed around and cooperates with first shield member 200 so that optical fiber connector 120 is no longer accessible. More specifically, when lever assembly 110 is in the closed position, optical fiber connector 120 is surrounded by end portions 210 and 220 of first shield member 200 as well as front portion 305, side portions 310, 315, and extended portions 311, 316 of second shield member 300.

When access is desired to connector 120, a technician must first lift lever assembly 110 in order to separate first shield member 200 and second shield member 300 enough to expose optical fiber connector 120. By so doing, lever assembly 110 causes circuit pack 100 to disengage from the backplane of the equipment shelf As a result, power being supplied to circuit pack 100, the components thereon, and the optical signal power being transmitted through optical fiber connector 120 is automatically cut off before a technician can access optical fiber connector 120. Additional features of the protection assembly can be advantageously used to provide the most effective protection for optical fiber connector 120 and the optical components connected thereto. These features include, for example, protection tabs 240 and 340, side portion 205, extended portions 311 and 316, curved portion 221, and the 25 degree or less rotation requirement for disengaging circuit pack 100 from the backplane.

Figure 16:
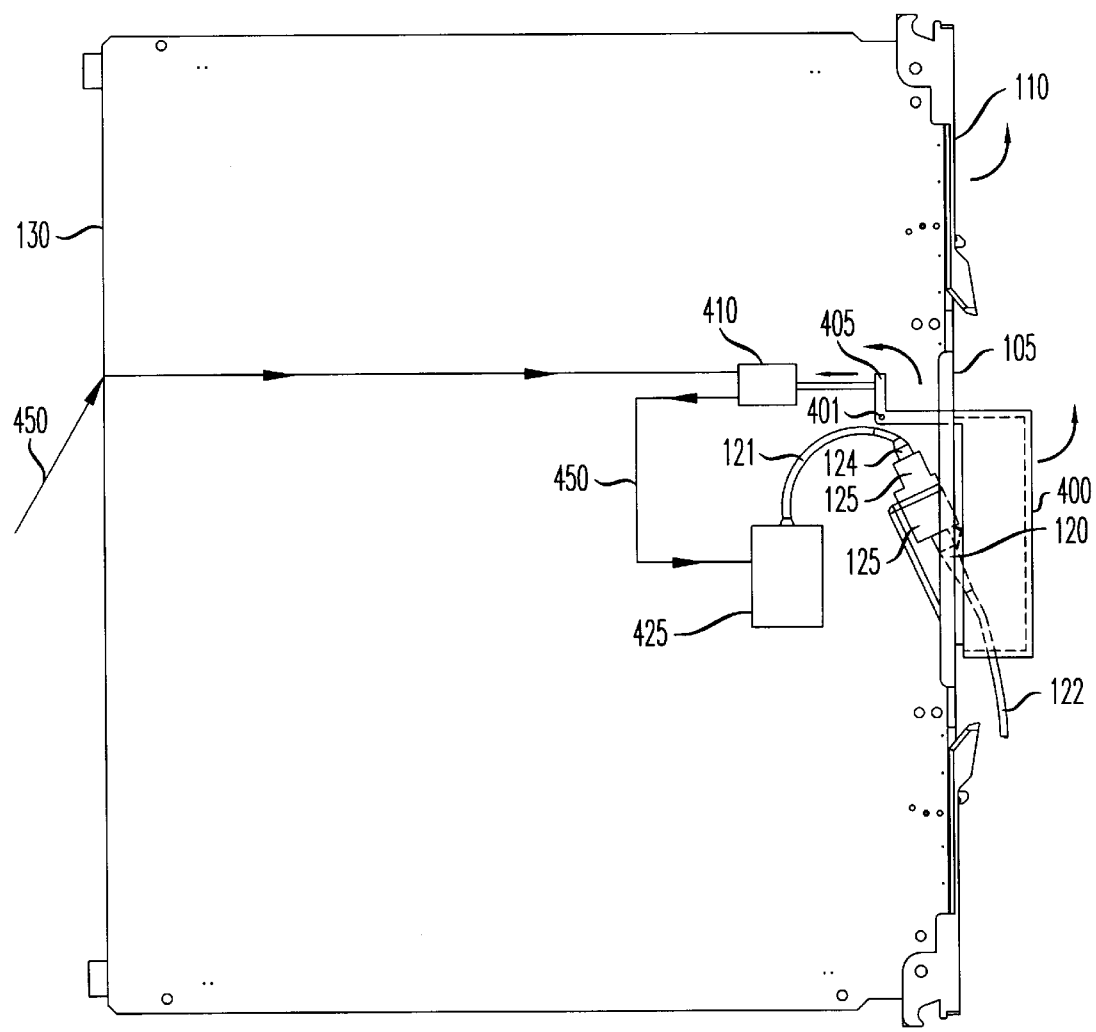
FIG. 16 is a perspective view of another embodiment of the protection assembly according to the principles of the invention.

FIG. 16 shows another embodiment of the invention which is useful for circuit packs in which connector sleeve 125, optical fiber connector 120 and optical fiber 122 may not be located adjacent to or nearby lever assembly 110. In this embodiment, the construction and operation of shield member 400 are similar to second shield member 300 (FIG. 4) with some notable differences. For example, shield member 400 does not include protection tab 340 and apertures 330 from the embodiment shown in FIG. 4, but does include an extension portion 405 and pivot point 401. As shown in this embodiment, shield member 400 is rotatably attached to circuit pack 100 about pivot point 401 and operates between an open and closed position in a similar manner as lever assembly 110 from the previous embodiments. Alternatively, protection assembly 400 may be otherwise attached to circuit pack 100, e.g., slidably mounted to the front of face plate 105. In addition to shield member 400, a power shut-off circuit 410 is coupled to component 425 on circuit pack 100. As will be described in more detail, power shut-off circuit 410 cooperates with extension portion 405 to automatically disconnect the flow of power to component 425 when shield member 400 is lifted to an open position to expose connector 120.

In operation, power may be supplied to component 425 when edge 130 is engaged in a backplane of an equipment frame (not shown). The flow of power to component 425 is indicated by arrow 450. When receiving power, component 425 is operable to supply signal power through optical fiber 121, connector 124, connector 120, and optical fiber 122 in a similar manner as previously described. While component 425 is supplying signal power, shield member 400 is in the closed position and cooperates with face plate 105 to prevent access to connector 120 protected thereunder.

When a technician lifts shield member 400 to its open position to gain access to connector 120, extension portion 405 cooperates with power shut-off circuit 410 to automatically cut off power supplied to component 425 on circuit pack 100. By automatically disconnecting power to component 425 when shield member 400 is lifted to its open position, optical signal power supplied by component 425 through connector 120 is automatically cut off prior to connector 120 being accessible. It should be noted that circuitry 410 may be implemented using techniques well-known to those skilled in the art. For example, circuitry 410 may be any type of circuitry capable of cutting off the flow of power between components circuitry 410, such as an electrical "trip" circuit or a toggle switch-based circuit.

This embodiment is also useful for applications in which it is not desirable to cut off power to all components on circuit pack 100, which otherwise occurs when circuit pack 100 is disengaged from the backplane as in the previous embodiments. In particular, this embodiment provides the option of only cutting off power to the particular component 425 on circuit pack 100 which is supplying optical signal power through connector 120.

Various modifications that relate to manufacturing and design choice may be made to the embodiments shown and described herein and are contemplated by the teachings of the invention. For example, second shield element 300 may be attached to or otherwise integrated with lever assembly 110 using many different techniques, including, but not limited to: mounting by fasteners or suitable adhesives; integral molding with lever assembly 110; and so on. Moreover, the particular design of second shield element 300 is also only meant to be illustrative. The important aspect of second shield element 300 is to ensure that access to optical fiber connector 120 is blocked when lever assembly 110 is in the closed position (i.e., when circuit pack 100 is engaged in the backplane and receiving power).

First shield member 200 may also be a slidable-type mechanism that is operable to cover or expose connector 120 by a sliding action. However, by itself, slidable first shield member 200 may be operated to expose optical fiber connector 120 prior to optical signal power being cut off. According to the principles of the invention, second shield member 300 on lever assembly 110 would therefore be needed to prevent first shield member 200 from sliding open to expose optical fiber connector 120 until lever assembly 110 has been opened enough to disengage circuit pack 100 from the backplane (i.e., to cut off optical signal power supplied through optical fiber connector 120). Consequently, various designs for second shield member 300 may be used for preventing first shield member 200 from sliding open. As such, the particular design alternatives shown in FIGS. 3 and 4 for first shield element 200 and second shield element 300 are meant to be illustrative only and not limiting.

In sum, the protection assembly according to the principles of the invention provides a simple and cost-effective solution for protecting connectors and other components from being damaged. The particular embodiments shown and described herein illustrate the benefits of such a protection assembly from a design, manufacturing, as well as operational perspective. It should be noted that these benefits can be realized whether the principles of the invention are applied in single degree-of-freedom embodiments or in multiple degrees-of-freedom embodiments. More specifically, the single degree-of-freedom mechanism is where the only action required to expose the connector is to operate the lever assembly which in turn facilitates the automatic cut off of power to the connector. The multiple degrees-of-freedom mechanisms could be those in which the lever assembly must be operated in addition to a slide mechanism, for example.

In view of the foregoing, it will be understood that particular embodiments described above are only illustrative of the principles of the invention, and various modifications will be apparent to those skilled in the art without departing from the spirit and scope of the invention. Accordingly, the scope of the present invention is limited only by the claims that follow.

What is claimed is:

1. An apparatus comprising:
   a circuit pack having a face plate and a connector that is accessible on the face plate; and
   a protection assembly disposed on the circuit pack, the protection assembly being operable to prevent access to the connector at the face plate until after signal power transmitted through the connector is automatically disconnected.

2. The apparatus according to claim 1, wherein the connector is an optical fiber connection through which optical signal power is transmitted.

3. The apparatus according to claim 2, wherein the circuit pack includes means for automatically disconnecting the optical signal power being transmitted through the optical fiber connector as a function of power being disconnected from the circuit pack.

4. The apparatus according to claim 2, wherein the optical fiber connector is coupled to a component on the circuit pack and wherein the circuit pack includes means for automatically disconnecting the optical signal power being transmitted through the optical fiber connector as a function of power being disconnected from the component on the circuit pack.

5. The apparatus according to claim 2, wherein the circuit pack includes a lever arrangement for disconnecting power to the circuit pack, and wherein the protection assembly further comprises:
   a first member attached to the face plate of the circuit pack in a location adjacent to the optical fiber connector; and
   a second member attached to the lever arrangement, wherein the first member and second member cooperate to prevent access to the optical fiber connector protected thereunder when the circuit pack is receiving power.

6. The apparatus according to claim 5, wherein the first member and the second member are separated to expose the optical fiber connector only after power is disconnected from the circuit pack.

7. An apparatus for protecting an optical fiber connector that is accessible on a face plate of a circuit pack, the circuit pack of the type having a lever arrangement capable of causing the circuit pack to engage and disengage a backplane of an equipment frame, wherein optical signal power is transmitted through the optical fiber connector when the circuit pack is engaged in the backplane, the apparatus comprising:
   a first shield member disposed on the face plate in a location adjacent to the optical fiber connector; and
   a second shield member disposed on the lever arrangement,
   wherein, when the circuit pack is engaged in the backplane, the first shield member and the second shield member cooperate to prevent access to the optical fiber connector protected thereunder.

8. The apparatus according to claim 7, wherein the first shield member and the second shield member are separated to expose the optical fiber connector only after the lever arrangement is operated to disengage the circuit pack from the backplane causing signal power transmitted through the optical fiber connector to be automatically disconnected.

9. The apparatus according to claim 8, wherein the lever arrangement is rotatable about a pivot point on the circuit pack, and wherein the lever arrangement is operable to disengage the circuit pack from the backplane within approximately a predetermined degree of rotation prior to the optical fiber connector being accessible.

10. The apparatus according to claim 9, wherein the predetermined degree of rotation is preferably about 25 degrees.

11. The apparatus according to claim 7, wherein the second shield member is integrally molded with the lever arrangement to form a unitary construction.

12. The apparatus according to claim 7, wherein the second shield member is removably attached to the lever arrangement.

13. An apparatus for protecting an optical fiber connector that is accessible on a face plate of a circuit pack, the circuit pack of the type having a lever arrangement capable of causing the circuit pack to engage and disengage a backplane of an equipment frame, wherein optical signal power is transmitted through the optical fiber connector when the circuit pack is engaged in the backplane the apparatus comprising:
   a first shield member disposed on the face plate in a location adjacent to the optical fiber connector, the first shield member including a side portion; and two opposing end portions extending from opposite ends of the side portion, each end portion having at least one aperture defined therein, wherein the two opposing end portions are capable of aligning flush with the face plate, the first shield member being mounted to the face plate via fasteners extending through the apertures, and wherein the side portion is capable of aligning perpendicular to the face plate in a location adjacent to the optical fiber connector; and a second shield member disposed on the lever arrangement, wherein, when the circuit pack is engaged in the backplane the first shield member and the second shield member cooperate to prevent access to the optical fiber connector protected thereunder.

14. The apparatus according to claim 13, wherein the first shield member further comprises:

a protection tab extending from the side portion at a point intermediate to the two opposing end portions;

wherein one of the two opposing end portions further comprises a curved portion extending therefrom.

15. The apparatus according to claim 7, wherein the second shield member comprises:

a front portion;

two opposing side portions extending from opposite sides of the front portion, the front portion and two opposing side portions jointly defining a rectangular enclosure therein; and each of the two opposing side portions including an extended portion positioned on a same end, the extended portions defining an opening therebetween through which an optical fiber can pass.

16. A circuit pack including a face plate, an optical fiber connector that is accessible on the face plate, and a lever arrangement capable of causing the circuit pack to engage and disengage a backplane of an equipment frame, wherein optical signal power is supplied through the optical fiber connector when the circuit pack is engaged in the backplane, the circuit pack further including:

a first shield member disposed on the face plate in a location adjacent to the optical fiber connector; and a second shield member disposed on the lever arrangement, wherein, when the circuit pack is engaged in the backplane, the first shield member and the second shield member cooperate to prevent access to the optical fiber connector protected thereunder.

17. The apparatus according to claim 16 wherein the circuit pack includes means for automatically disconnecting the optical signal power being transmitted through the optical fiber connector, prior to the connector being accessible, by operation of the lever arrangement to disengage the circuit pack from the backplane.

18. The apparatus according to claim 17, wherein the first shield member and the second shield member are separated to expose the optical fiber connector only after the circuit pack is disengaged from the backplane.

19. An apparatus for protecting an optical fiber connector that is accessible on a face plate of a circuit pack, the optical fiber connector capable of receiving signal power supplied by a component on the circuit pack, the apparatus comprising:

a shield member attached to the circuit pack, the shield member being operable between an open position and a closed position, the shield member in the closed position cooperating with the face plate to prevent access to the optical fiber connector while the optical fiber connector is receiving signal power from the component; and a power shut-off circuit coupled to the component, the power shut-off circuit being activated in response to the shield member being moved to the open position to automatically disconnect power to the component thereby disconnecting signal power supplied by the component through the optical fiber connector prior to the optical fiber connector being accessible.

20. The apparatus according to claim 19, wherein the shield member is rotatably attached to the circuit pack, the shield member being rotatable about a pivot point to engage the power shut-off circuit.

21. The apparatus according to claim 19, wherein the shield member comprises:

a front portion;

two opposing side portions extending from opposite sides of the front portion, the front portion and two opposing side portions jointly defining a rectangular enclosure therein, each of the two opposing side portions including an extended portion positioned on a same end, the extended portions defining an opening therebetween through which an optical fiber can pass; and an extension arm extending from at least one of the two opposing side portions, the extension arm capable of engaging the power shut-off circuit as the shield member is operated to the open position.

22. An apparatus comprising:

a circuit board having a face plate and a connector that is accessible on the face plate; and a protection assembly disposed on the circuit board, the protection assembly being operable to prevent access to the connector at the face plate until after signal power transmitted through the connector is automatically disconnected.

23. The apparatus according to claim 22, wherein the connector is an optical fiber connector through which optical signal power is transmitted.

24. The apparatus according to claim 23, wherein the circuit board includes means for automatically disconnecting the optical signal power being transmitted through the optical fiber connector as a function of power being disconnected from the circuit board.

25. The apparatus according to claim 23, wherein the circuit board includes a lever arrangement for disconnecting power to the circuit board, and wherein the protection assembly further comprises:

a first member attached to the face plate of the circuit board in a location adjacent to the optical fiber connector; and a second member attached to the lever arrangement, wherein the first member and second member cooperate to prevent access to the optical fiber connector protected thereunder when the circuit board is receiving power, wherein the first member and the second member are separated to expose the optical fiber connector only after power is disconnected from the circuit board.

* * * * *